United States Patent [19]

Lang

[11] Patent Number: 4,837,532
[45] Date of Patent: Jun. 6, 1989

[54] MMIC (MONOLITHIC MICROWAVE INTEGRATED CIRCUIT) VOLTAGE CONTROLLED ANALOG PHASE SHIFTER

[75] Inventor: Richard J. Lang, Liverpool, N.Y.

[73] Assignee: General Electric Company, Syracuse, N.Y.

[21] Appl. No.: 112,611

[22] Filed: Oct. 26, 1987

[51] Int. Cl.[4] .......................................... H03H 11/20
[52] U.S. Cl. ...................................... 333/164; 333/161
[58] Field of Search ........................ 333/164, 161, 156

[56] References Cited

U.S. PATENT DOCUMENTS

| | | | |
|---|---|---|---|
| 3,230,539 | 1/1986 | Schell | 333/161 X |
| 3,246,265 | 4/1966 | Smith-Vaniz | 333/164 X |
| 3,778,643 | 12/1973 | Jaffe | 333/161 X |
| 4,604,591 | 8/1986 | Vasile | 333/164 X |

FOREIGN PATENT DOCUMENTS 73916  6/1981  Japan ........................... 333/156

OTHER PUBLICATIONS

Broad-Band Diode Phase Shifters, r. V. Garver/IEEE Transactions on Microwave Theory and Techniques, vol. MTT-20, No. 5, May 1972/pp. 314-323.
Wide-Band Monolthic Phase Shifter, Y. Ayasli, S. W. Miller, R. Mozzi and L. K. Hanes/IEEE Transactions on Microwave Theory and Techniques, vol. MTT-32, No. 12, Dec. 1984/pp. 1710-1714.

Primary Examiner—Eugene R. LaRoche
Assistant Examiner—Benny T. Lee
Attorney, Agent, or Firm—Richard V. Lang; Carl W. Baker; Fred Jacob

[57] ABSTRACT

The invention relates to a voltage controlled analog phase shifter for operation at millimeter and microwave wavelengths using MMIC (Monolithic Microwave Integrated circuit) fabrication techniques. The phase shifter is formed of an artificial transmission line consisting of multiple unit elements in which each unit element contains a serial transmission line-inductance and a shunt diode capacitance which is variable as a function of an applied potential. In the design, the interconnecting transmission lines may be a small fraction of a wavelength, substantially less than one-quarter wavelength, and of high impedance relative to the characteristic impedance of the phase shifter. In consequence of the lumped design, each unit element, and a phase shifter using a plurality of such unit elements may be very small. The design also exhibits a low to negligible power consumption.

6 Claims, 2 Drawing Sheets

MMIC (MONOLITHIC MICROWAVE INTEGRATED CIRCUIT) VOLTAGE CONTROLLED ANALOG PHASE SHIFTER

BACKGROUND OF THE INVENTION

1. Field of the Invention

The invention relates to integrated circuits for use at microwave and millimeter wave frequencies, and more particularly to voltage controlled analog phase shifters of MMIC design 2. Prior Art There is a need in microwave and millimeter wave electronically steered, phased array antennas for a voltage controlled phase shifter. In such systems, the antenna beam can be steered in azimuth and/or elevation by altering the phase of the excitation of each radiating element.

There are many known networks that can be employed for phase shifting applications at microwave and millimeter wave frequencies. Networks of the common classes have been reviewed in an article by R. V. Garver entitled "Broad Band Diode Phase Shifters", IEEE Transistors Vol. MTT 20, No. 5, May 1972. These include loaded lines, hybrid coupled reflection networks, switched lines and lumped element networks (high pass/low pass). Applications exist for both digital and analog phase shifters, the latter being favored when adaptive control of the beam is sought.

The realizations of known circuits in monolithic microwave embodiments have tended to require excessive chip area and excessive power consumption.

SUMMARY OF THE INVENTION

It is an object of the invention to provide an improved voltage controlled analog phase shifter fabricated by integrated circuit techniques for operation at microwave and millimeter wave frequencies.

It is another object of the invention to provide a novel voltage controlled analog phase shifter of MMIC design requiring less substrate area.

It is still another object of the invention to provide a novel voltage controlled analog phase shifter of MMIC design exhibiting negligible power consumption.

These and other objects of the invention are achieved in accordance with the present invention in a novel analog phase shifter based on the principle that a shunt capacitive element in a low pass network causes a phase shift dependent upon the capacitance. A variable capacitance, therefore, produces a variable phase shift and at the same time a reflection causing a standing wave and a degradation of the input VSWR of the circuit.

The degradation in VSWR is overcome in accordance with the invention, by absorbing the shunt capacitance into an artificial transmission line network with repetitive unit elements, where the shunt capacitance and series inductance of an element are adjusted to give the required network impedance for a good input match (and specified cut-off frequency). A cascade of these unit elements in which the shunt capacitors are variable, gives a variable transmission phase that is the sum of the individual phase shifts of each unit element. The degradation of the input match is kept within bounds by limiting the capacitance variation per unit element, and increasing the number of such elements.

In a practical embodiment of the invention, the artificial transmission line is realized by a succession of serially connected microstrip transmission line-inductors and shunt connected variable capacitance diodes of value C formed on a common monolithic substrate in a MMIC format. The first and last sections of the transmission line have an inductance of value L/2 while the intermediate sections have an inductance of value L. The lines are also designed to exhibit a reactive impedance which is high relative to the characteristic impedance of the phase shifter at operating frequencies. All sections of transmission line have a length substantially less than a quarter wavelength. The values of L and C are chosen by a well known relationship to achieve the desired phase shifter characteristic impedance.

The invention is best carried out with a substantial number of unit elements, for example sixteen.

DESCRIPTION OF THE DRAWINGS

The inventive and distinctive features of the invention are set forth in the claims of the present application. The invention itself together with further objects and advantages thereof may best be understood by reference to the following description and accompanying drawings in which:

FIG. 1A being a plan view of the entire phase shifter consisting of sixteen individual phase shifter sections that form an artificial transmission line; and FIG. 1B being a perspective view of a variable capacitance element and the connections between the capacitance element and the inductive elements within a section of the phase shifter;

DESCRIPTION OF THE PREFERRED EMBODIMENT

Figure 1A:
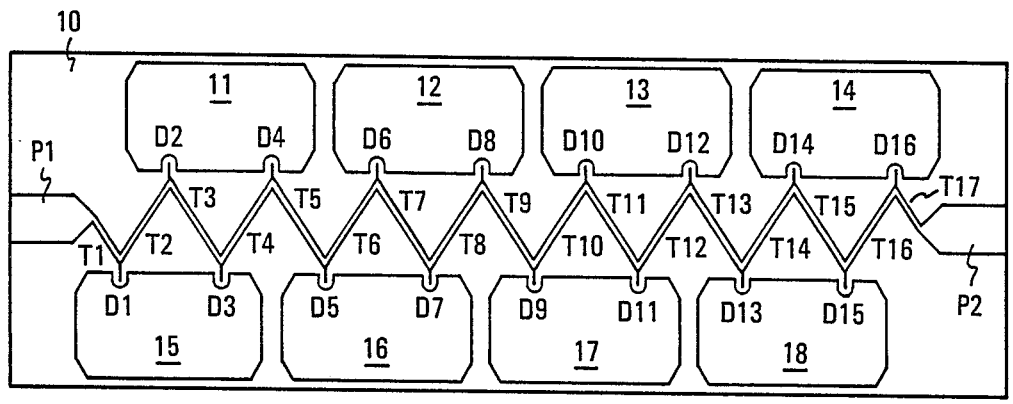
FIGS. 1A and 1B are views of a novel voltage controlled continuously variable phase shifter fabricated by monolithic microwave integrated circuit techniques.
Figure 1B:
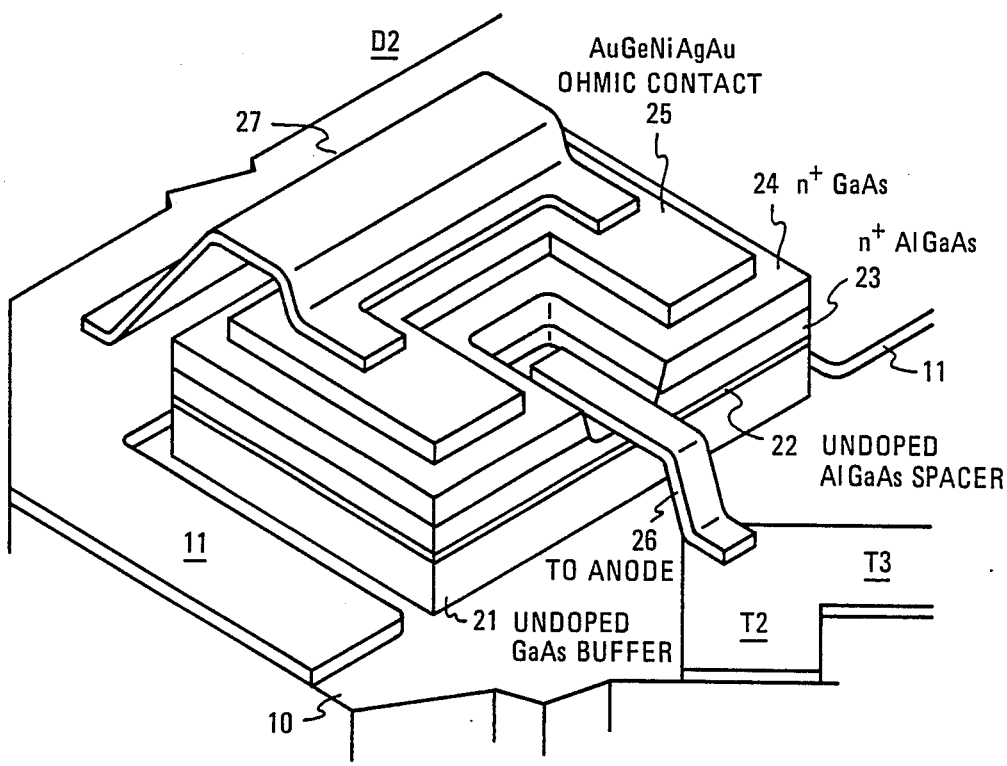

A novel continuously variable voltage controlled phase shifter in accordance with the invention is illustrated in FIGS. 1A and 1B. The novel phase shifter may be fabricated using monolithic microwave integrated circuit techniques upon a Gallium Arsenide substrate. While the phase shifter may be used at frequencies below 20 GHZ, its primary advantage lies in a range extending above 20 GHZ, in which it is capable of achieving the required 360° of phase shift on a substrate whose dimensions are as small as 0.018×0.060 inches for a 44 GHZ design, it being recognized that the dimensions may be smaller or larger as a function of the frequency.

The novel phase shifter is designed to have a characteristic impedance of 50 ohms and is bidirectional in that of two signal ports, either one may become the input port with the other port becoming the output port. The illustrated embodiment operates over a 2 GHZ frequency band in the vicinity of 44 GHZ and provides a continuous analog phase shift of from zero to 360° under a single voltage control. In a practical embodiment, the insertion loss for the phase shifter is theoretically less than 10.6 db and the voltage standing wave ratio (VSWR) is less than 1.6:1. The loss is largely dependent upon the cut-off-frequency (Fco) of the variable capacity semi-conductor. The cut-off frequency is defined as follows:

$$Fco = 1.0/2\pi RC \qquad (1)$$

where R and C are the series resistance and capacitance respectively of the device.

The novel phase shifter may be used as a separate MMIC component in a hybrid arrangement employing larger numbers of like phase shifter components or as a "cell" in a larger integrated MMIC arrangement. A useful application of large numbers of phase shifters, is in a beamformer in a phase-steered transmit or receive array in which each element of the array is provided with a variable phase shifter, the phase of each phase shifter being electrically adjusted to form the beam and steer the array.

As will be explained, the novel phase shifter is realized as an artificial transmission line made up of multiple sections, connected in cascade, each section consisting of an equivalent pair of series connected inductances and a shunt connected variable capacitor connected in a "tee" configuration. The equivalent inductors are made up of short lengths of high impedance transmission line, and the variable capacitors are two electrode semi-conductors of a design optimized to exhibit a specified capacitance change with voltage and minimum equivalent series resistance. Appropriate semiconductors include diodes and field effect transistors and high electron mobility transistors modified by connection of the source and drain electrodes together, the control voltage being applied between gate and source/drain electrodes. The capacitance is typically the depletion capacitance and the resistance is predominantly the undepleted semi-conductor resistance and the contact resistance. The elements of the phase shifter are disposed on the Gallium Arsenide substrate illustrated in FIG. 1A.

Referring now to FIG. 1A, a simplified plan view of the novel phase shifter is shown. The elongated Gallium Arsenide substrate is shown at 10 with signal ports P1 and P2 centrally disposed at either end. The Gallium Arsenide substrate is of semi-insulating material and typically 0.005" in thickness. It is provided with a metallization on its undersurface to which connections may be made by plated through holes and which may provide a common ground plane for conductors disposed on the upper surface of the substrate thereby forming microstrip transmission lines.

The signal port to the left, using the orientations in FIG. 1A is designated P1 and the signal port to the right is designated P2. A first row of four plated through holes 11, 12, 13 and 14 is disposed adjacent to the upper edge of the substrate and extends parallel to the major dimension of the substrate. These plated through holes are elongated parallel to the major dimension of the integrated circuit, permitting each to provide a ground contact for two variable capacitance semi-conductors, yet to be described. A second row of four plated through holes 15, 16, 17 and 18 is disposed adjacent to the lower edge of the substrate. These plated through holes 15–18 are of the same elongated configuration as the plated through holes 11–14, permitting each to provide a ground contact for two variable capacitance semi-conductor devices. The members of the upper row of plated through holes are displaced along the major dimension of the substrate slightly to the right of the plated through holes in the lower row. The ground contacts are "broken-up" in order to prevent propagation of undesirable slotline modes between what would otherwise be two parallel ground conductors.

The plated through holes, whose distribution over the upper surface of the substrate 10 has just been described, are of a conventional configuration. The under surface of the substrate is provided with a continuous metallization and the upper surface of the semi-insulating Gallium Arsenide substrate is suitably prepared for acceptance of a layer of metallization. The plated through hole accordingly provides a metallization which contacts the under surface metallization, lines the wall of the vertical hole in the substrate material and extends over the upper surface of the substrate in the manner generally depicted by the plan view of FIG. 1B.

The variable capacitance elements of the arificial delay line are provided by the variable capacitance semi-conductor devices or diodes D1 to D16. These semi-conductor devices are two terminal devices disposed in each of the sixteen U-shaped indentations formed in the inward facing edges of the metallizations 11–18. The formation and the connection of the semi-conductor devices to the plated through holes and to the transmission line elements which interconnect the capacitance elements are best seen in FIG. 1B. In the scale of FIG. 1A these details cannot be shown, but it should be indicated that the semi-conductor devices, being two terminal devices, each have one terminal connected to the upper surface metallization of a plated through hole and one terminal connected to two transmission line elements so as to maintain serial continuity within the phase shifter.

The U-shaped indentations are disposed in two rows of eight; one row of eight being formed in the upper row of plated through holes 11–14 and the other row of eight being formed in the lower row of metallizations 15–18 to permit equivalent connections between semi-conductor devices along the phase shifter. The spacing of the indentations within each hole metallization and between adjacent hole metallizations is made equal and the off-set between indentations on the upper row of metallizations is displaced by one-half the interval between adjacent indentations on the lower row of metallizations so that the linear distances from the indentations on one row of hole metallizations to the nearest pair of indentations on the opposing pair of hole metallizations is equal.

The semi-conductor diodes D1–D16, providing the voltage controlled capacitance, are disposed in the indentations of the hole metallizations, the numbering sequence following from left to right and entailing locations in alternately lower and upper metallizations. A first electrode of each of the semi-conductor devices is electrically connected to the adjacent plated through hole thus providing a very short low inductance ground path to each variable capacitance device, and a second electrode is connected to the two transmission line elements, acting as equivalent inductances, which cross the space between rows of hole metallizations and contact the corresponding second electrodes of preceding and succeeding semi-conductor devices in the phase shifter.

The phase shifter is completed by a succession of narrow conductive strips T1 to T17 which form short lengths of high impedance transmission line commencing at the inner tip of the pad P1, continuing to the semi-conductor diodes D1 to D17, and terminating at pad P2. In the process, the first transmission line segment T1, which is approximately one-half the length of the transmission line segments T2 to T16, is connected between the pad P1 and the second terminal of "diode" D1. The next full length transmission line section T2 is connected between the second terminal of diode D1 and the second terminal of the diode D2. Similarly, full length transmission line segments T2 to T16 are connected between the second terminal of the diode in one row of eight diodes to a second terminal of a succeeding higher numbered diode in the other row of diodes. At the second terminal of the diode D16, transmission line D17, which is approximately one-half the length of the transmission lines T2 to T16 connects the second terminal of the diode D16 to the pad P2, completing the phase shifter.

The physical construction of a variable capacitance device and its interconnection with the virtual inductances is illustrated in FIG. 1B. The semi-insulating Gallium Arsenide substrate 10 is shown in the foreground with variable capacitance diode D2 being the principal subject of the illustration. The diode D2 is formed on a Mesa formed above the plane of the semi-insulating substrate using a construction commonplace to high electron mobility transistors. The Mesa includes an undoped Gallium Arsenide buffer layer 21, an undoped Aluminum Gallium Arsenide spacer 22, the high electron mobility channel 23 of highly doped n+ Aluminum Gallium Arsenide. The gate electrode contacts the region 23. The next layer 24 is of highly doped n+ Gallium Arsenide, upon which an ohmic contact 25 corresponding the source/drain is applied. In order to achieve optimum contact, the ohmic contact 25 is one involving Gold, Germanium, Nickel, Silver, and Gold. The electrode corresponding to the gate may be termed the "anode" and that corresponding to the source/drain the "cathode", recognizing that the device is a rectifier favoring current flow of the appropriate polarity.

The variable capacitance diode is dimensionally quite small having a capacitance of only a few tens of femto Farads for operation at millimeter wavelengths. The central gate electrode or anode is elongated and representable as a finger having a width of ¼ micron and a length of 30 microns, with the U-shaped source/drain or cathode extending around the finger. The foregoing dimensions are exemplary, and may be adjusted to increase the gate width while holding the gate area and hence, device capacitance approximately constant. This adjustment is in the interests of increasing manufacturing yield and avoiding the need for electronic beam lithography. Because of the Mesa construction, the contacts to the anode and to the cathode are both elevated in relation to the semi-insulating Gallium Arsenide substrate and are optionally air or dielectric bridges. Connection is made from the anode (gate) to the surface metallization of the microstrip transmission lines T2, T3 by a first air bridge 26 which spans the intervening region and contacts only the gate and common terminus of transmission line elements T2, T3. Similarly, contact is made between the cathode of the semiconductor device by a second air bridge 27 which makes the connection between the metallization 11 of a plated through hole and the upper cathode (source/drain) contact 25.

One may, of course, use another form of variable capacitance diode than the one illustrated. For instance, the device may be fabricated using FET compatible material. Lower losses are normally available on materials specifically designed for varactor diode realization. However, the advantage of a variable capacity device using HEMT or FET material is in the ability to integrate the phase shifter with other circuits that employ active three-terminal transistors on a common substrate.

A phase shifter designed for 44 gHz operation, and employing sixteen sections, and in which the diodes are formed on HEMT material to allow integration with other active components, is calculated to exhibit a continuous phase shift from zero to 360° under a voltage variation through zero bias of about one and one-half volts. A 0°–360° analog phase variation contemplates a 3.6:1 capacitance swing in the individual capacitive elements.

Figure 3:
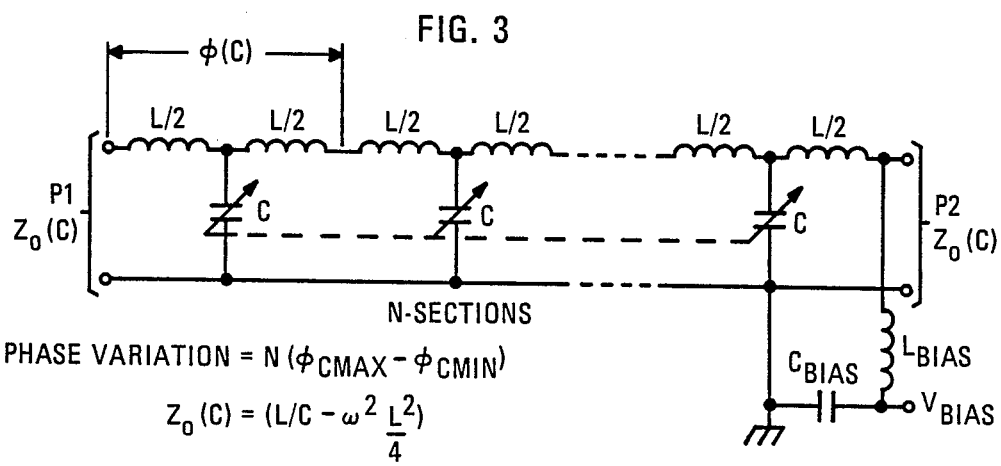
FIG. 3 is a simplified equivalent circuit representation of the novel phase shifter of FIG. 1, illustrating the theoretical model, which the individual phase shifter sections approximate.

For simplicity, the control bias circuitry has not been shown in FIG. 1A, but is depicted in FIG. 3. The control circuit requires a filter to exclude signal frequencies connected between the source of control bias and the signal terminal to which it is applied. Since the transmission lines are of low dc resistance and the currents small or negligible, one connection at either end or at an intermediate point on the phase shifter is adequate. The second terminal may be the ground plane of the substrate.

Figure 2:
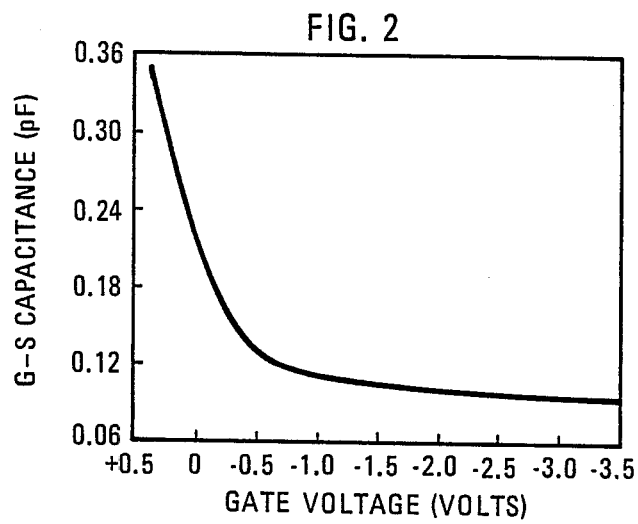
FIG. 2 is a graph illustrating the variation of gate-to-source/drain capacitance with voltage of a high electron mobility transistor (HEMT) that has its source and drain electrodes connected together, which device, suitably scaled, is repeated in each section of the phase shifter to provide the voltage responsive capacitance means to achieve continuous phase variation.

FIG. 2 provides a graph of the variation of the gate-to-source capacitance with voltage of a HEMT device. In this instance, the dimensions of the "gate" electrode are 0.25×150 micrometers. The illustrated capacitance must be scaled down by a factor of approximately 5 for the specific design. This is achieved by scaling the "gate" area. The capacitance versus voltage characteristic is non-linear, and accordingly, may be accommodated by using a non-linear conversion of the control signal or by restricting the adjustment to the more linear portion of the characteristic. The number of phase shifters may also increased to achieve a larger phase shift range.

In the 44 GHz phase shifter design, the maximum required diode capacity is 0.07 pF with a 3.6:1 variation and an estimated cut-off frequency of 350 GHz. (A higher cut-off frequency would be preferable, figures as high as 2000 GHz being attainable with other device types.) The gate electrode is 30 microns long 0.25 microns in width, connected to the transmission line elements. In the same example, the length of the full length transmission line elements (T2-T16) is 185 microns with a width of 14 microns. The half length transmission line elements (T1 and T17) are 92.3 microns in length and also of 14 microns width.

An understanding of the design is best approached by use of the simplified equivalent circuit representation of FIG. 3. In FIG. 3, the phase shifter may be regarded as an artificial transmission line consisting of sixteen tee sections connected between the input pads P1 and P2. The drawing illustrates the first two and last of the sixteen tee sections. Each tee section consists of a pair of serially connected inductive elements of value L/2 and a variable capacitor of value C having one terminal connected to the node common to the two inductive elements and the other terminal connected to ground.

In the realization of the equivalent circuit of FIG. 3, the serial inductances are realized by short lengths of high impedance transmission line. More particularly, the first serial inductance of value L/2 is realized by a short length of transmission line T1 and the capacitor C realized by the diode D1. The second serial inductance of value L/2 in the first section and the first serial inductance of value L/2 in the second section are realized by the transmission line T2 extending between diodes D1 and D2. As one proceeds along the real phase shifter, each real transmission line element T2 to T16 represents two successive inductances of value L/2, the first a member of a prior tee section and the second a member of the following tee section. The final transmission line T17 has a length equal to approximately half that of the transmission lines T2 to T16. Transmission line T17 connects diode D16 to the pad P2 and has an inductance of the value L/2.

The phase shifter is designed to match the input impedance to which the phase shifter is connected. The characteristic impedance (Zo) of the phase shifter may be approximated as follows:

$$Z_o = (L/C - w^2 L^2/4)^{\frac{1}{2}}$$

where w=angular frequency=$2\pi f$.

This initial value for the characteristic impedance is based on ideal circumstances including "lumped" inductances which ignore such parasitics as the self inductance of the plated through hole ground connections and neglects the series and shunt resistance of real semiconductor devices.

The simplified expression is useful as an aid to understanding the design. If the value of L and C are selected for an exact input match at a specified frequency, no reflection and no phase shift will occur. If, however, a phase shift is sought, and this is achieved by varying the capacitance of the shunt device, the match will no longer be exact and both a reflection and a phase shift will occur, proportionate to the impedance mismatch.

Should the phase shifter consist of only a single tee section, a large phase shift, achieved by a large adjustment in the value of the capacitor in a single section filter, would provide a very large mismatch and be intolerable. If, however, a large number (e.g. 16) of elemental sections are cascaded, with each elemental section required only to produce a small fraction of the total phase shift (e.g. 1/16), then the mismatch may be relatively small. The input VSWR degradation may be kept within acceptable bounds defined by the capacitance variation. Using more elements reduces the required capacitance swing per element and hence improves the achievable VSWR. More elements however produce more insertion loss forcing a compromise between minimum VSWR and maximum tolerable loss. The calculated worst case VSWR for the 44 GHz design is less than 1.6:1.

Should the individual diodes be perfect diodes without loss, one could readily increase the number of sections without limit. Practical upper limits with available diodes could be higher than 16. In these cases, use of this higher number of sections would reduce the capacitance swing required of each device, and reduce the VSWR proportionately.

The selection of sixteen phase shifter sections in the exemplary 44 GHz design is set by the loss (e.g. 10.6 db) which can be tolerated. This loss is produced using semi-conductors of the type herein described compatible with Gallium Arsenide HEMT or FET processing. Sixteen filter sections, which produce 10.6 db of loss, represents a practical compromise for diodes of this "quality". The figure of merit for the diode is the Fco (i.e. the cut-off frequency). While the indicated design goals can be met at 44 GHz, with diodes having a cut-off frequency of 350 GHz, a much reduced loss would result with diodes with higher cut-off frequencies (e.g. 1000–2000 GHz). A semi-conductor compatible with the desired processing but further optimized for the variable capacitance role, would reduce losses significantly.

Figure 4:
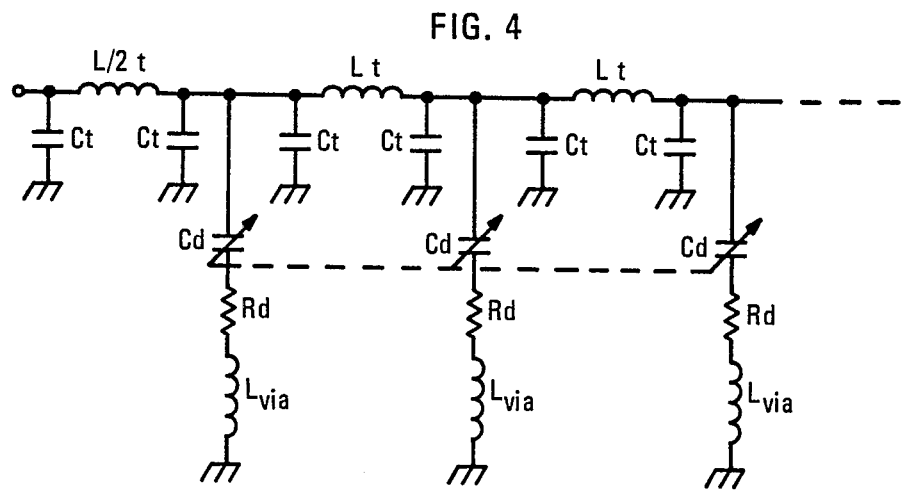
FIG. 4 is a more detailed equivalent circuit representation of the novel phase shifter of FIG. 1.

The indicated hardware dimensions are derived from a more exact model of the phase shifter than that of FIG. 3. The more exact model, which takes into account the parasitic elements, is illustrated in FIG. 4. The illustrated hardware design benefits from the more complex model and is also further optimized with the aid of circuit analysis and with optimization software which examines the several conflicting trade offs required to meet a comprehensive specification.

As illustrated in the more detailed equivalent circuit of FIG. 4 (showing only the first three sections), the transmission line is best represented by a pi network including a pair of shunt capacitances at either end of a series inductance. The series inductance is that which is specifically utilized while the shunt capacitances are disregarded in the simplified model. In the more accurate model of FIG. 4, however, these capacitances ct coincide with the placement of the variable capacitance semi-conductor devices. These semi-conductor devices are accordingly, made smaller to absorb the capacitance already presented by the transmission line realization. The semi-conductor devices are modelled as series RLC elements to account for diode resistance Rd, diode capacitance Cd and plated through hole inductance Lvia (0.015 nH).

The foregoing computer analysis indicates a maximum insertion loss of 10.6 db with a 6.0 db slope. The computed impedance match is typically 20 db with a 13 db worst-case value corresponding to a VSWR of <1.6:1. The computed phase versus frequency characteristics show that the structure has a constant time delay and exhibits an increasing phase-shift with frequency.

The term "artificial transmission line" has been used to denote the present phase shifting structure. The term is intended to mean a transmission line formed of discrete lumped elements, as opposed to a "continuous transmission line" represented by a coaxial line, stripline or a wave guide. The term "artificial transmission line" is also not intended to include a periodically loaded continuous transmission line. While the present phase shifting structure uses sections of transmission line, each section is short, substantially less than a quarter wavelength, and therefore properly regarded as a "lumped" inductance element, or more precisely as a lumped inductance accompanied by two shunt capacitors in a "pi" network. The diodes appear as variable capacitors primarily, and while having serial parasitic resistance and inductance are also lumped components. At frequencies where the device dimensions are an appreciable fraction of a wavelength, the lumped models of the individual components would be better modelled as "distributed" networks, but the design concept remains unchanged. The advantage of the use of a short transmission line section as a lumped inductance element is in the reduction in size of a multi-unit element phase shifter. In a traditional periodically loaded continuous transmission line, the intervals between loads for minimum reflection are at one quarter wavelength intervals to insure that destructive cancellation of reflections occur. The present lumped artificial line avoids the spacial requirement of that design concept. In the example, the length of individual transmission line inductors and therefore the size of the complete phase shifter, may be reduced using the inventive principles, by a factor of three or four.

A major advantage of the artificial transmission line design is therefore its compactness. A sixteen section filter may be fabricated in an area of 0.060" by 0.018" for operation at 44 GHZ. This size is sufficiently small to permit use of relatively large numbers of such phase shifters on a common chip shared with additional electronic circuitry.

A second advantage of the circuit, which is its low power consumption, is best realized using conventional (e.g. Schottky) diodes in preference to HEMT or FET devices with source and drain interconnected. A diode using HEMT or FET geometry optimized for gain devices, when forward biased to achieve the desired range of capacitance variation, may draw current but the current is often not large enough to be of concern. Conventional diodes which exhibit the desired capacitance changes with bias voltage may remain reversely biased through the adjustment range and thus may never enter forward conduction. In the first case, the current drain is quite small compared to competitive designs and in the second case, the current drain, which consists of diode leakage current only, is negligible.

What is claimed is:

1. A monolithic microwave integrated circuit (MMIC) voltage controlled, analog phase shifter having a specified characteristic impedance (Zo) and specified worst case VSWR and requiring minimum substrate area at millimeter and microwave wavelengths; comprising:
   (A) a substrate of semi-insulating Gallium Arsenide having a ground plane on the under surface thereof,
   (B) a first input-output port,
   (C) a second input-output port,
   (D) an artificial transmission line comprising
      (1) an (n+1) fold succession of sections of microstrip transmission line, where n is an integer, consisting of said ground plane and a conductor formed on the upper surface of said substrate, the sections having a high impedance relative to said characteristic impedance Zo and being serially connected between said first and second input-output ports, the first and last sections having an inductance value of L/2 and the intermediate sections having an inductance value of L, all sections of transmission line having a length substantially shorter than one-quarter wavelength;
      (2) an n fold plurality of semi-conductor elements having at least a first and second terminal, each semi-conductor element having a variable capacitance of the value C, the capacitance thereof being a function of an applied voltage, the first terminal of each semi-conductor element being connected to a respective connection between transmission line sections and the second terminal coupled to substrate ground through a plated through hole,
   said semi-conductor elements being arranged along a first line in a sequence of odd numbered semi-conductor elements, and arranged along a second line in a sequence of even numbered semi-conductor elements, the second line being displaced from the first line and parallel thereto, the intermediate members of said (n+1) fold succession of transmission line sections extending between said succession of odd and even numbered semi-conductor elements in said first and second lines,
   and said plated through holes being arranged in a second pair of parallel lines, outside of and close to said two lines of semi-conductor elements to permit direct paths without cross-overs for each transmission line section between consecutive first terminals of said semi-conductor element and short connections between the second terminal of each semi-conductor element and ground,
   the semi-conductor elements in one line being staggered in relation to the semi-conductor elements in the other line to provide equal spacing and thereby equal length transmission sections between the first terminals of said semi-conductor elements,
   the values of L and C being chosen to achieve the desired characteristic impedance in approximate satisfaction of the expression $$Zo=(L/C-w^2L^2/4)^{\frac{1}{2}}$$

where w=the angular frequency 2 pi f neglecting transmission line and semi-conductor element parasitics, and
   (E) means for applying a control voltage between the first and second terminals of each variable capacitance semi-conductor element to achieve the desired phase shift.

2. The phase shifter set forth in claim 1 wherein said semi-conductor elements are field effect transistors, each having source, drain and gate electrodes, said source and drain electrodes being connected to said second terminal of the element, and said gate electrode being connected to said first terminal of the element.

3. The phase shifter set forth in claim 1 wherein said semi-conductor elements are high electron mobility transistors each having source, drain and gate electrodes, said source and drain electrodes being connected to said second terminal of the element, and said gate electrode being connected to said first terminal of the element.

4. The phase shifter set forth in claim 1 wherein said plurality of plated through holes is approximately n/2 in number, the semi-conductor elements in one line being connected in pairs to individual plated through holes and the semi-conductor elements in the other line are connected in pairs to individual plated through holes, so that the succession of plated surfaces on said substrate is interrupted to prevent an undesired stripline mode.

5. The phase shifter set forth in claim 1 wherein said semi-conductor elements are Schottky diodes.

6. The phase shifters set forth in claim 1 wherein said semi-conductor elements are varactor diodes.

* * * * *